United States Patent
Ryu

(10) Patent No.: US 6,924,217 B2
(45) Date of Patent: Aug. 2, 2005

(54) METHOD OF FORMING TRENCH IN SEMICONDUCTOR DEVICE

(75) Inventor: Sang Wook Ryu, Chungcheongbuk-Do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/731,144

(22) Filed: Dec. 10, 2003

(65) Prior Publication Data

US 2005/0009264 A1 Jan. 13, 2005

(30) Foreign Application Priority Data

Jul. 12, 2003 (KR) ................................ 10-2003-0047630

(51) Int. Cl.$^7$ ............................................ H01L 21/425
(52) U.S. Cl. ...................... 438/527; 438/528; 438/705
(58) Field of Search ................................ 438/424, 527, 438/528, 551, 705, 735

(56) References Cited

U.S. PATENT DOCUMENTS

| 5,641,380 A | * | 6/1997 | Yamazaki et al. | .......... 438/304 |
| 5,662,768 A | * | 9/1997 | Rostoker | .................... 257/301 |
| 6,281,093 B1 | * | 8/2001 | Pradeep et al. | ............. 438/424 |

* cited by examiner

*Primary Examiner*—Trung Dang
(74) *Attorney, Agent, or Firm*—Mayer, Brown, Rowe & Maw LLP

(57) ABSTRACT

The present invention is provided to form a trench in a semiconductor device, wherein by performing an ion implanting process to an area of a semiconductor substrate in which the trench would be formed to cause lattice defects in the area before forming the trench, an etching speed of the area is increased in subsequent trench forming processes. As a result, it is possible to prevent micro trenches from being formed in edge portions of patterns and to suppress a micro loading effect to be generated depending upon pattern sizes.

15 Claims, 2 Drawing Sheets

METHOD OF FORMING TRENCH IN SEMICONDUCTOR DEVICE

BACKGROUND

1. Field of the Invention

The present invention relates to a method of forming a trench in a semiconductor device and, more specifically, to a method of forming a trench in a semiconductor device capable of controlling micro trenches and a micro loading effect in an etching process for forming the trench.

2. Discussion of Related Art

Recently, with promotion of high integration and high performance of a semiconductor, a technology of manufacturing a semiconductor device with a high degree of integration has been also required. A technology of narrowing a gate width of a metal oxide semiconductor field effect transistor (MOSFET) and an element isolating technology are associated most closely with the promotion of high integration of a semiconductor device. As the element isolating technology, a recessed-local oxidation of silicon (R-LOCOS) technology has been used widely. However, a trench forming technology is used in almost all devices having a line width of 0.25 $\mu$m or less.

In the element isolating technology using the current trench forming technology, unexpected micro trenches are formed mainly when a silicon substrate is dry-etched. When a voltage is applied to and a current is allowed to flow in a device, a leakage current generated due to a stress field by lattice defects in a periphery of the trench does fatal damages to reliability of the device. Further, depths of trenches are different depending upon spaces due to a micro loading effect. A pad oxide film (with a thickness of, for example, 30 Å to 200 Å) and a pad nitride film (with a thickness of, for example, 500 Å to 2000 Å) are deposited on a silicon substrate, and a photoresist pattern (with a thickness of, for example, 5000 Å to 12000 Å) is formed thereon. Thereafter, when a dry etching process using the photoresist pattern as an etching mask is performed, differences in etching speed are caused depending upon density differences of the trenches, whereby the trench depths are different between an area in which the trenches are densely formed (hereinafter, referred to as a "dense area") and an area in which the trenches are sparsely formed, not densely formed, (hereinafter, referred to as a "sparse area"). For example, when the trench depth is 2000 Å, the etched depth can be varied between 1700 Å to 2300 Å, depending upon performance and condition of an etching apparatus. This can cause difference in property of element isolation depending upon wafer portions or wafers.

A main reason for causing the difference in etching speed between the dense area and the sparse area is that a height through which the etching byproducts generated in the etching process should pass is too large and the height obstructs reaching of the ions and radicals to a surface to be etched, thereby causing the difference in etching speed between the dense area and the sparse area. This reason very seriously influences a high-performance semiconductor device of 0.13 $\mu$m or less class, and the difference in etched depth due to the difference in etching speed causes difference in electrical characteristics of an oxide film in the element isolation, such as a threshold voltage, a channel voltage, a punch through between the dense area and the sparse area, etc.

SUMMARY OF THE INVENTION

Accordingly, the present invention is directed to controlling micro trenches and a micro loading effect occurring in an etching process for forming a trench.

According to a preferred embodiment of the present invention, there is provided to a method of forming a trench in a semiconductor device, comprising: a step of depositing a first pad film and a second pad film on a semiconductor substrate; a step of patterning the first and second pad films to expose the semiconductor substrate; a step of performing an ion implanting process to the exposed semiconductor substrate to cause lattice defects in an area of the semiconductor substrate into which the ions are implanted through the ion implanting process; and a step of performing an etching process using a trench etching mask, wherein the area of the semiconductor substrate in which the lattice defects are caused in the above step is etched more rapidly than an area in which the lattice defects are not caused, thereby forming the trench.

One aspect of a preferred embodiment of the present invention is to provide a method of forming a trench in a semiconductor device, comprising: a step of depositing a first pad film and a second pad film on a semiconductor substrate; a step of patterning the first and second pad films; a step of forming spacers on inner side walls of the patterned first and second pad films; a step of performing a first ion implanting process to the semiconductor substrate exposed between the spacers; a step of performing an etching process to decrease thicknesses of the spacers, thereby increasing a line-width of a trench to be formed in subsequent processes; a step of performing a second ion implanting process to the semiconductor substrate; and a step of etching an area of the semiconductor substrate in which lattice defects are caused through the first and second ion implanting processes, thereby forming the trench.

BRIEF DESCRIPTION OF THE DRAWINGS

The above and other objects, advantages and features of the present invention will become apparent from the following description of preferred embodiments given in conjunction with the accompanying drawings, in which.

DETAILED DESCRIPTION OF PREFERRED EMBODIMENTS

Figure 1:
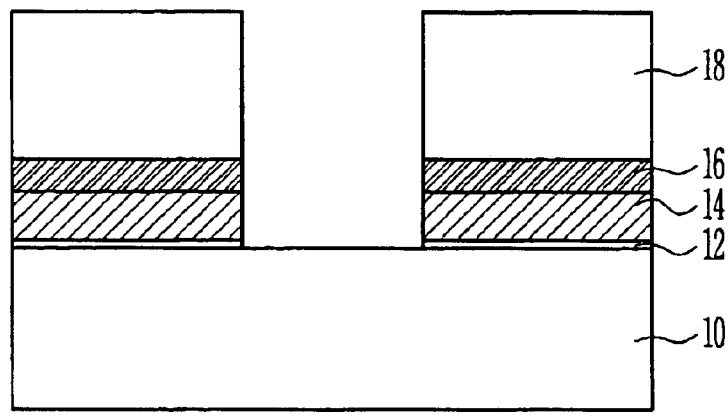
FIGS. 1 to 6 are cross-sectional views illustrating a method of forming a trench in a semiconductor device according to a preferred embodiment of the present invention.

Now, preferred embodiments of the present invention will be described with reference to the accompanying drawings. However, the present invention is not limited to the embodiments disclosed in the following description, but can be implemented into various changes and modifications. Thus, these embodiments are only intended to completely inform those skilled in the art of a scope of the present invention.

FIGS. 1 to 6 are cross-sectional views illustrating a method of forming a trench in a semiconductor device according to an embodiment of the present invention. Here, the same reference numerals of reference numerals shown in FIGS. 1 to 6 indicate the same elements having the same function.

Referring to FIG. 1, a semiconductor substrate 10 cleaned through a pre-cleaning process is provided. In the pre-cleaning process, the semiconductor substrate 10 is cleaned with a Diluted HF (DHF) solution, and then cleaned with an SC-1 ($NH_4OH/H_2O_2/H_2O$) solution, or sequentially cleaned with a Buffer Oxide Etchant (BOE) solution and the SC-1 solution.

A pad oxide film 12 is deposited on the semiconductor substrate 10 cleaned through the pre-cleaning process as described above. At that time, for the purpose of processing crystal defects of an upper surface of the semiconductor substrate 10, it is preferable that the pad oxide film 12 is subjected to an oxidation process using a dry or wet oxidation method in a temperature in the range of 750° C. to 800° C., to have a thickness of 30 Å to 500 Å. Then, a pad nitride film 14 is deposited on the pad oxide film 12. At that time, the pad nitride film 14 may be formed out of a nitride film or a nitric oxide film. Further, it is preferable that the pad nitride film 14 is deposited to have a thickness of 500 Å to 3000 Å, considering a height of a high density plasma (HDP) oxide film for an element isolation film to be buried in a subsequent trench 24 (see FIG. 6). Thereafter, a capping layer 16 is deposited on the pad nitride film 14. At that time, it is preferable that the capping layer 16 is formed out of an oxide film to have a thickness of 300 Å to 2000 Å.

A photoresist (not shown) is applied to the top surface of the whole structure in which the capping layer 16 has been deposited, and then an exposure process and a development process using a photo mask are performed thereto, thereby forming a photoresist pattern 18. Then, an etching process using the photoresist pattern as an etching mask is performed, so that the capping layer 16, the pad nitride film 14 and the pad oxide film 12 can be all patterned, or the pad oxide film 12 can remain by a predetermined thickness. A reason for allowing the pad oxide film 12 to remain by a predetermined thickness is to prevent the top surface of the semiconductor substrate 10 from being damaged during the etching process. Here, when the pad oxide film 12 remains by a predetermined thickness, the remaining pad oxide film 12 is completely patterned through a subsequent process for forming spacers 20 (see FIG. 2). At that time, in the etching process using a dry etching method, $C_xH_yF_z$ (where x, y and z are 0 or natural numbers) gas is used as a main etching gas, and any one of $SF_6$, $Cl_2$, $N_2$, $O_2$, HBr, Ar and He is used as an additive gas. Thereafter, the photoresist pattern 18 is removed through a strip process.

Figure 2:
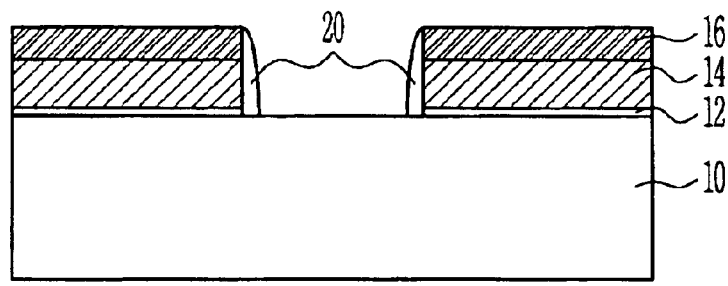

Referring to FIG. 2, spacers 20 are formed on inner side walls of the pad oxide film 12, the pad nitride film 14 and the capping layer 16 patterned in FIG. 1. The spacers 20 are formed by depositing oxide-based material on the whole structure and performing an etching process thereto. At that time, it is preferable that the spacers 20 are formed to have a thickness of 100 Å to 1000 Å. This etching process may be performed using the same method as the etching process performed in FIG. 1, and may be performed using a blanket etching method or an etch-back method without an etching mask.

Figure 3:
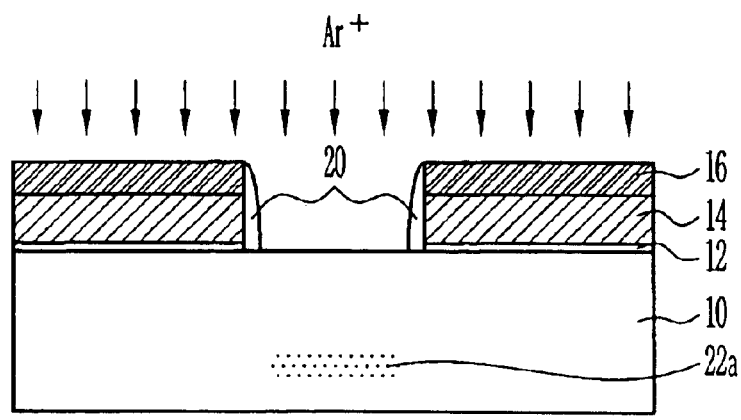

Referring to FIG. 3, after forming the spacers 20 in FIG. 2, an ion implanting process (hereinafter, referred to as a "first ion implanting process") is primarily performed. The first ion implanting process is preformed to the semiconductor substrate 10 exposed in FIG. 2, by using inert gas in the periodic table such as Ar, He, Ne, Kr, Xe, and so on. At that time, the first ion implanting process is carried out with an ion dose of $1.0 \times 10^{10}$ ions/cm$^2$ to $1.0 \times 10^{18}$ ions/cm$^2$ and an ion implanting energy of 3 KeV to 60 KeV, so that the ions implanted through the first ion implanting process are distributed in the semiconductor substrate with a range of about 1000 Å to 4000 Å. The reference numeral "22a" shown in FIG. 3 indicates the distribution of ions implanted through the first ion implanting process.

Figure 4:
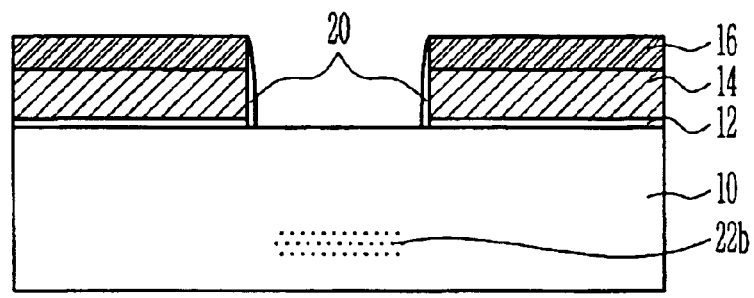

Referring to FIG. 4, after finishing the first ion implanting process in FIG. 3, an etching process for increasing a line width is performed. This etching process is carried out to the spacers 20, by using a wet or dry etching method. At that time, the wet etching method uses a wet etchant containing fluorine such as HF or BOE. The dry etching method is performed using the same method as the etching process described with reference to FIG. 2. The spacers 20 are etched by 50 Å to 950 Å through the etching process. As a result, the line width is increased by the etched thickness.

Figure 5:
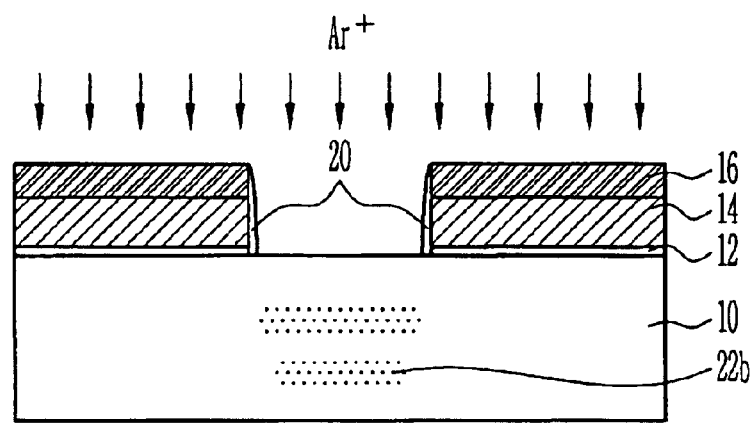

Referring to FIG. 5, an ion implanting process (hereinafter, referred to as a "second ion implanting process") is secondarily performed. In the second ion implanting process, similarly to the first ion implanting process, the inert gas in the periodic table such as Ar, He, Ne, Kr, and Xe is used. At that time, the second ion implanting process is carried out with an ion dose of $1.0 \times 10^{10}$ ions/cm$^2$ to $1.0 \times 10^{18}$ ions/cm$^2$ and an ion implanting energy of 3 KeV to 55 KeV, so that the ions implanted through the second ion implanting process are distributed in the semiconductor substrate 10 with a range of about 300 Å to 3000 Å. The reference numeral "22b" shown in FIG. 5 indicates the distribution of ions implanted through the first and second ion implanting processes.

Figure 6:
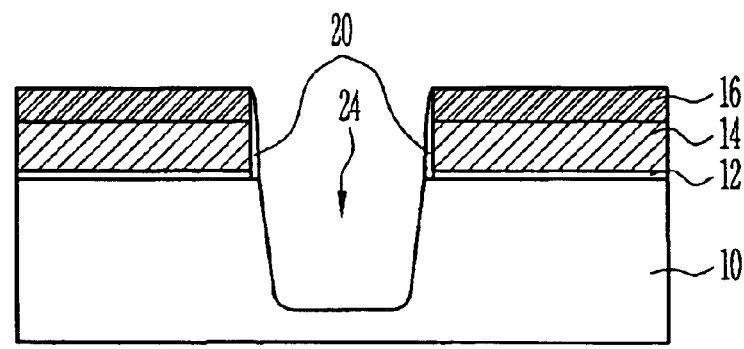

Referring to FIG. 6, after finishing the second ion implanting process in FIG. 5, the trench 24 is formed through an etching process. At that time, in the etching process using a dry etching method, gas containing elements of a radical group in the periodic table such as $Cl_2$, $BCl_3$, $SF_6$ and so on are used as a main etching gas, and any one of Ar, $O_2$, $N_2$, He, and so on is used as an additive gas.

As describe above, two ion implanting processes as in FIGS. 3 and 5 are carried out for the purpose of causing the lattice defects in a center portion of the semiconductor substrate 10 in which the trench 24 should be formed. As a result, the etching speed in the center portion (that is, an area in which the lattice defects are caused) is more increased than that in edge portions (that is, areas in which the lattice defects are not caused). Therefore, micro trenches can be prevented from being formed in the edge portions of the trench pattern and a micro loading effect generated depending upon pattern sizes can be also suppressed.

Although the foregoing description has been made with reference to the preferred embodiments, it should be noted that the embodiments are intended to exemplify the present invention, not to limit the present invention. Furthermore, it is to be understood by the ordinary skilled in the art that changes and modifications of the present invention may be made without departing from the spirit and scope of the present invention and appended claims.

As described above, according to the present invention, by performing an ion implanting process to an area of a semiconductor substrate in which a trench would be formed to cause lattice defects in the area before forming the trench, an etching speed of the area is increased in subsequent trench forming processes. As a result, it is possible to prevent micro trenches from being formed in edge portions of patterns and to suppress a micro loading effect to be generated depending on pattern sizes.

What is claimed is:

1. A method of forming a trench in a semiconductor device, comprising:
   (a) a step of depositing a first pad film and a second pad film on a semiconductor substrate;
   (b) a step of patterning the first pad film and the second pad film;
   (c) a step of forming spacers on inner side walls of the patterned first and second pad films;
   (d) a step of performing a first ion implanting process to the semiconductor substrate exposed between the spacers;

(e) a step of performing an etching process to decrease thicknesses of the spacers, thereby increasing a linewidth of a trench to be formed in subsequent processes;

(f) a step of performing a second ion implanting process to the semiconductor substrate; and (g) a step of etching an area of the semiconductor substrate in which lattice defects are caused through the first and second ion implanting processes, thereby forming the trench.

2. A method of forming a trench in a semiconductor device according to claim 1, wherein the first and second ion implanting processes use an inert gas in the periodic table.

3. A method of forming a trench in a semiconductor device according to claim 2, wherein the inert gas is selected from the group consisting of He, Ne, Ar, Kr, and Xe.

4. A method of forming a trench in a semiconductor device according to claim 1, wherein the first ion implanting process is performed with an ion dose in a range of $1.0 \times 10^{10}$ ions/cm$^2$ to $1.0 \times 10^{18}$ ions/cm$^2$ and an ion implanting energy in a range of 3 KeV to 60 KeV.

5. A method of forming a trench in a semiconductor device according to claim 1, wherein ions implanted through the first ion implanting process in the step of (d) are distributed in the semiconductor substrate with a range of about 1000 Å to 4000 Å.

6. A method of forming a trench in a semiconductor device according to claim 1, wherein the second ion implanting process is performed with an ion dose in a range of $1.0 \times 10^{10}$ ions/cm$^2$ to $1.0 \times 10^{18}$ ions/cm$^2$ and an ion implanting energy in a range of 3 KeV to 55 KeV.

7. A method of forming a trench in a semiconductor device according to claim 1, wherein ions implanted through the second ion implanting process in the step of (f) are distributed in the semiconductor substrate with a range of about 300 Å to 3000 Å.

8. A method of forming a trench in a semiconductor device according to claim 1, wherein the step of (a) further comprises a step of depositing an oxide film on the second pad film.

9. A method of forming a trench in a semiconductor device, comprising:

(a) a step of depositing a first pad film and a second pad film on a semiconductor substrate;

(b) a step of patterning the first pad film and the second pad film;

(c) a step of forming spacers on inner side walls of the patterned first and second pad films;

(d) a step of performing an etching process to decrease thickness of the spacers, thereby increasing a linewidth of a trench to be formed in subsequent processes;

(e) a step of performing an ion implanting process to the semiconductor substrate exposed between the spacers;

(f) a step of etching an area of the semiconductor substrate in which lattice defects are caused through the ion implanting processes, thereby forming the trench.

10. A method of forming a trench in a semiconductor device according to claim 9, wherein the ion implanting process uses an inert gas in the periodic table.

11. A method of forming a trench in a semiconductor device according to claim 10, wherein the inert gas is selected from the group consisting of He, Ne, Ar, Kr, and Xe.

12. A method of forming a trench in a semiconductor device according to claim 9, wherein the ion implanting process is performed with an ion dose in a range of $1.0 \times 10^{10}$ ions/cm$^2$ to $1.0 \times 10^{18}$ ions/cm$^2$ and an ion implanting energy in a range of 3 KeV to 60 KeV.

13. A method of forming a trench in a semiconductor device according to claim 9, wherein the ion implanting process is performed with an ion dose in a range of $1.0 \times 10^{10}$ ions/cm$^2$ to $1.0 \times 10^{18}$ ions/cm$^2$ and an ion implanting energy in a range of 3 KeV to 55 KeV.

14. A method of forming a trench in a semiconductor device according to claim 9, wherein ions implanted through the ion implanting process are distributed in the semiconductor substrate with a range of about 300 Å to 3000 Å.

15. A method of forming a trench in a semiconductor device according to claim 9, wherein the step of (a) further comprises a step of depositing an oxide film on the second pad film.

* * * * *